United States Patent [19]

Höfer et al.

[11] 4,112,426
[45] Sep. 5, 1978

[54] APPARATUS FOR CONVERTING ANALOG SIGNALS INTO DIGITAL SIGNALS AND DIGITAL SIGNALS INTO ANALOG SIGNALS

[75] Inventors: Ernst Höfer; Klaus Wintzer, both of Munich, Fed. Rep. of Germany

[73] Assignee: Siemens Aktiengesellschaft, Munich, Fed. Rep. of Germany

[21] Appl. No.: 718,673

[22] Filed: Aug. 30, 1976

[30] Foreign Application Priority Data

Aug. 29, 1975 [DE] Fed. Rep. of Germany ....... 2538580
Sep. 29, 1975 [DE] Fed. Rep. of Germany ....... 2543388
Sep. 30, 1975 [DE] Fed. Rep. of Germany ....... 2543608

[51] Int. Cl.² .......................................... H03K 13/02
[52] U.S. Cl. ............................. 340/347 C; 179/15 A
[58] Field of Search ................ 179/2 DP, 2 R, 15 A, 179/15 BD, 15 AT; 178/2, 3; 340/347 C, 347 AD

[56] References Cited

U.S. PATENT DOCUMENTS

| 3,889,063 | 6/1975 | Slavin ................................ 179/15 A |
| 3,984,829 | 10/1976 | Zwack ............................ 340/347 C |

Primary Examiner—Charles D. Miller
Attorney, Agent, or Firm—Schuyler, Birch, Swindler, McKie & Beckett

[57] ABSTRACT

Apparatus for a telecommunication system having subscriber stations constructed to send and receive analog signals which are communicated from one station to the other by means of digital signals is described. Each subscriber station is equipped with a converter for converting received digital signals into analog signals and analog signals into digital signals for transmission. The converter circuit employs an analog to digital converter constructed to work according to the iterative principle and including a binary counter and a buffer register, the stages of which are enabled, respectively, by predetermined counter stage outputs. A digital to analog converter is connected to receive the outputs of the bistable stages forming the buffer register. The counter is connected to trigger the conversion of a received digital signal into an analog signal and subsequently to initiate the conversion of an analog signal into a digital signal; this occurs only after a specified calling bit sequence is received by the converter.

6 Claims, 3 Drawing Figures

APPARATUS FOR CONVERTING ANALOG SIGNALS INTO DIGITAL SIGNALS AND DIGITAL SIGNALS INTO ANALOG SIGNALS

BACKGROUND OF THE INVENTION

The invention relates to apparatus for converting analog signals, more particularly pulse amplitude modulation (PAM) signals, into digital signals, more particularly pulse code modulation (PCM) signals, and for converting the digital signals into analog signals. The invention is particularly useful in telecommunication installations having telephone subscriber stations, each station comprising a transmitting unit supplying analog signals and a receiving unit receiving analog signals, and which throughout the duration of pulses of pulse trains, with pulses recurring in successive cycles in pulse frames, can be connected to signal receiving units receiving digital signals or, as the case may be, to signal output units supplying digital signals.

It is known to use analog to digital converters for the foregoing form of operation, as shown in commonly assigned U.S. Pat. No. 4,056,820 filed on July 27, 1976 and issued to Hofer on Nov. 1, 1977. In the operating mode of the analog-to-digital converter as described in the above patent, and particularly of the counter associated therewith, it is possible that a digital signal to be converted into an analog signal will appear within an ongoing counting cycle of the counter at a time when the digital signal cannot be accepted immediately in a buffer register of the analog-to-digital converter. Thus, it becomes necessary to use an input register at the input of the analog-to-digital converter receiving the digital signals. Due to its buffering function, the buffer register must be a static input register until the reception of an accepted digital signal. Although such a static input register, in the case of conversion of digital signals with serial bits into analog signals, can at the same time be shared for a necessary serial-parallel conversion of these bits, it is sometimes desirable to manage with a simpler serial-parallel converter, particularly with a dynamic serial-parallel converter such as, for example, with a delay line to which are applied at one end the serial bits of the digital signal and which supplies the bits of the digital signal on a number of equidistant taps corresponding to the number of bits making up a digital signal.

It is, therefore, an object of the invention to provide a means for the conversion of digital signals into analog signals in accordance with the system shown in U.S. Pat. No. 4,056,820 without the buffering of digital signals in a static input register and for the conversion of digital signals with serial bits into analog signals with a simple dynamic serial-parallel converter.

SUMMARY OF THE INVENTION

In accordance with the invention, the foregoing and other objects are achieved in that the counter of the analog-to-digital converter, beginning with a specified output counter position, is put into operation for the immediate control of the conversion of a digital signal into an analog signal and for the subsequent control of the conversion of an analog signal into a digital signal, and thereafter of a digital signal into an analog signal, only after a specified calling signal bit sequence is applied to the input register when the telephone station is in its working condition. In the latter state the subscriber station is ready to receive and to supply analog signals. The counter in the converter is again driven to its specified output counter position when the associated telephone station is switched over to its idle condition. As a result, during the conversion of digital signals into analog signals complex buffering of the digital signals by means of a static input register is not needed since the digital signals can immediately be converted into analog signals with relatively little circuit complexity. The input register may thus be a simple dynamic input register for bridging possible brief delays resulting from setting.

If the bits making up the digital signal appear in a serial mode, there is in the present case also the advantage that a simple dynamic input register, such as a delay line, to which, at one end, are applied the bits of the digital signal and which supplies on equidistant taps the bits of the particular digital signal in parallel. The bits of the digital signal, after a serial-parallel conversion, are then used to activate the register stages of the buffer register.

According to an advantageous development of the invention, the calling signal bit sequence is detected by means of a detector circuit which, upon detection of a calling signal bit sequence, supplies a "1" signal which in coincidence with a "1" signal supplied by the associated telephone station during its working condition is used to operate a switch connecting a counter input of the counter to an output of a clock generator. The advantage thereof is that the conversion of digital signals into analog signals and that of analog signals into digital signals can be initiated very easily.

According to a further development of the invention, there is applied from the output of a bistable circuit to the operating input of the aforementioned switch an enabling signal which closes the latter, a set signal being applied from the detector circuit to the set input of the bistable circuit upon detection of a given calling signal bit sequence, and to the reset input of which a reset signal is applied when the associated telephone station is switched over to its idle condition. The advantage is that the counter can enter into service when a given calling signal appears for the first time.

According to another advantageous development of the invention, the reset signal applied to the reset input of the bistable circuit is shared for resetting the counter to the output counter position. The advantage is that it is easily ensured that when the counter enters into service it immediately goes to the counter position where the conversion of a digital signal into an analog signal takes place.

According to still another advantageous development of the invention, upon detection of a given calling signal bit sequence, the detector circuit supplies a calling signal to the receiving unit of the associated telephone station when the telephone station is in its idle condition. The calling signal is canceled when the particular telephone station is switched to its working condition. The advantage is that one can easily signal to the receiving unit of the associated telephone station that specified analog signals intended therefor shall be supplied from its associated analog-to-digital converter.

According to still another development of the invention, the calling signal is applied from a signal generator to the receiving unit of the telephone station over a switch which, through activation by means of a bistable circuit, is changed over to its closed position in the event that the bistable circuit is activated by the detector circuit and which is opened in the event that the bistable circuit is switched over to its reset condition. To this end, there is applied to the reset input of the bistable circuit a control signal appearing during the working condition of the telephone station. In this way it is easily ensured that a first appearance of the given calling signal bit sequence leads to the supply of a calling signal to the associated telephone station, and also that from the telephone station involved the supply of the calling signal can be canceled by switching it over to its working condition.

According to another development of the invention, it is of advantage to the development last discussed if a reset signal is applied to the reset input of the bistable circuit over a delay element from the output of the bistable circuit controlling the enabling input of said switch after the delay interval provided for by the delay element has expired. In this way it is easily ensured that after expiration of a desired interval defined by the delay interval of the delay element the supply of a calling signal to the associated telephone station is automatically terminated. This can particularly be of advantage if the telephone station in question cannot be switched over to its working condition, e.g. because it is not occupied by an operator.

According to another advantageous development of the invention, to control from the telephone station the conversion of analog signals to be supplied by the transmitting unit of the telephone station into digital signals in case of non-appearance of digital signals to be converted into analog signals, a request signal requesting the allocation of a pulse train is first supplied, and the counter of the associated analog-to-digital converter is not activated until the appearance of the prespecified calling signal bit sequence throughout the duration of a pulse of a pulse train allocated to the associated telephone station for the control of the conversion processes. This teaching results in the advantage that the counter of the analog-to-digital converter which, in its first phase, is ready to operate is put into service for converting analog signals into digital signals at the time when, due to the allocation of a pulse train with pulses recurring in successive cycles in pulse frames, transmission of such digital signals to a signal output unit is made possible; to a certain extent this is indicated by the appearance of the calling signal bit sequence.

According to still another advantageous development of the invention, an operating supply voltage is only applied to the analog-to-digital converter and its associated telephone station in response to the appearance of a separate instruction, and such instruction is derived from the appearance of digital signals to be converted into analog signals or, as the case may be, from the appearance of a signal indicating the switching of the associated telephone station to the working condition when it is ready to supply or to receive analog signals. The advantage is that with very little circuit complexity no power is consumed unnecessarily during those intervals when no conversion takes place and the telephone station is in its idle condition.

According to a practical development of the switching arrangement described hereinabove, the detector circuit is coupled to the input of the analog-to-digital converter designed for accepting digital signals to be converted into analog signals, and, moreover, it is at all times connected to the operating supply voltage sources. In this way, a control signal can be obtained with very little circuit complexity from the prespecified calling signal bit sequence.

According to another advantageous development of the invention, the enabling input of the switch connecting the analog-to-digital converter and the associated telephone station to the operating supply voltage generator is coupled to an output of a bistable circuit, whose set input can be controlled by the control signal supplied by said detector circuit and by the "ready-to-operate" signal of the associated telephone station. The reset input of the bistable circuit is connected to a source of a reset signal which may be applied in the event that the associated telephone station is switched over from its working condition to its idle condition. This results in the advantage that with comparatively little circuit complexity the supply voltage of the analog-to-digital converter and of the associated telephone station is ensured during the period of conversion.

BRIEF DESCRIPTION OF THE DRAWINGS

The principles of the invention will be more readily understood by reference to the description of preferred embodiments given hereinbelow in conjunction with the accompanying drawing.

DETAILED DESCRIPTION OF THE PREFERRED EMBODIMENTS

Figure 1:
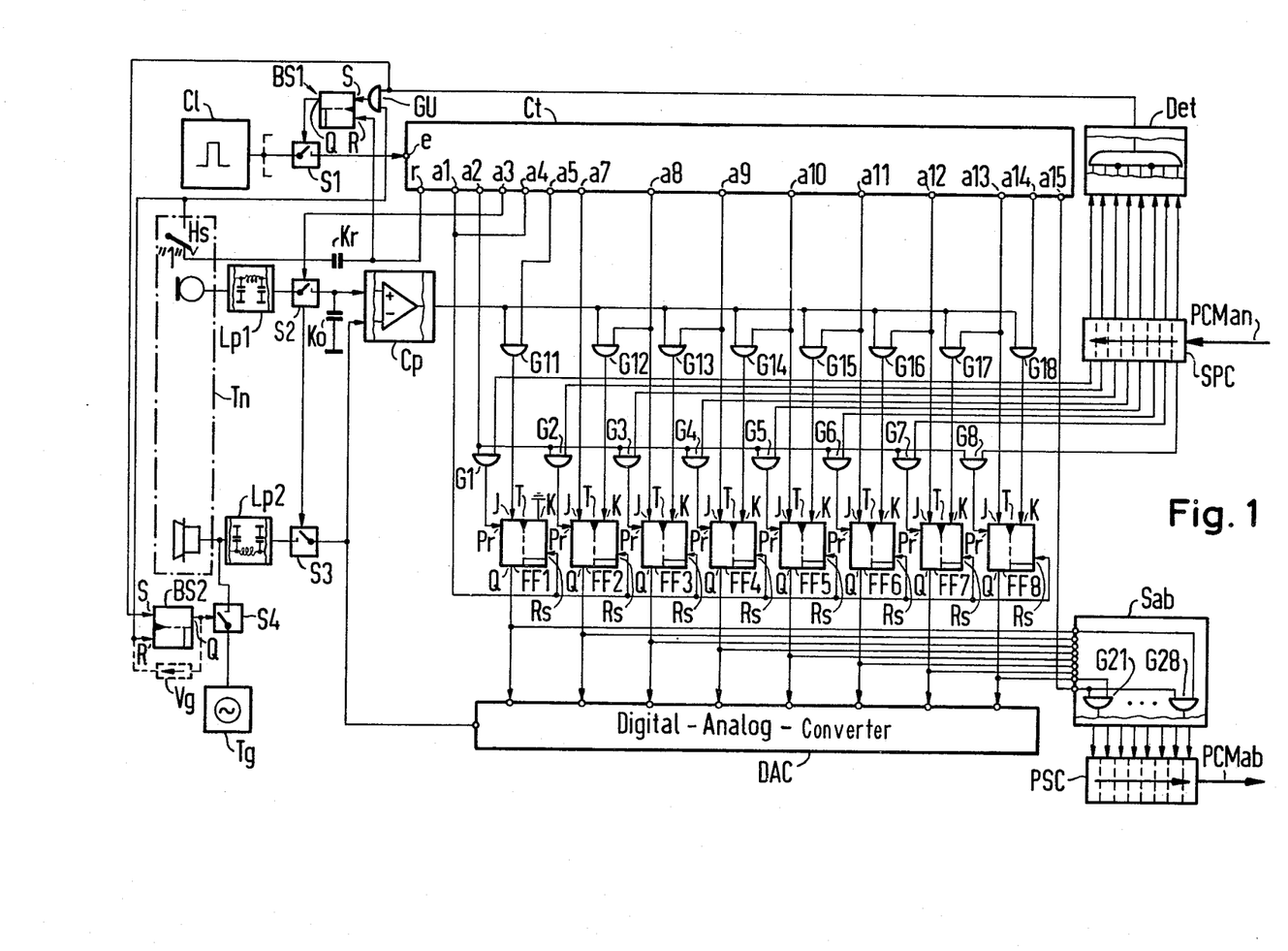
FIG. 1 is a schematic diagram of a circuit arrangement constructed according to the invention.

FIG. 1 shows schematically a telephone station Tn having a transmitting unit shown in the upper part of FIG. 1 and a receiving unit shown in the lower part of FIG. 1. The telephone station Tn, which may particularly be a telephone station of a PCM time division multiplex telephone switching system, is connected by its transmitting unit to a capacitor Ko by means of a low-pass filter Lp1 and a switch S2. One input of a comparator Cp, which is an analog comparator, is connected to the capacitor Ko. The comparator Cp may, for example, comprise a differential amplifier connected by its noninverting input (+) to the capacitor Ko. The comparator Cp is connected by another input to the output of a digital-to-analog converter DAC. The inverting input (−) of the differential amplifier mentioned earlier may be connected to the input of the comparator Co.

Logic elements G11 to G18 made up of AND gates are connected by one input each to the output of the comparator Cp. Thus, to a certain extent the inputs of the AND elements G11 to G18 constitute enabling inputs. The AND elements G11 to G18 are connected by their other inputs to outputs a5, a7, a9, a10, a11, a12 or a14 of a multistage binary counter Ct. In the present case, the counter Ct is a 16 stage, 1-out-of $n$ counter. The AND gates G11 to G18 are connected by their outputs to one input each of bistable circuits FF1 to FF8. The bistable circuits FF1 to FF8 form register stages of a buffer register, and are conventional JK multivibrator each having control inputs J and K, a clock pulse input T, a set input Pr, and a reset input Rs, as well as an output Q. Of the AND gates G11 to G18, the AND gate G11 is coupled by its output to the J input of the bistable multivibrator FF1, while the AND elements G12 to G18 are coupled by their outputs to the K inputs of the bistable multivibrators FF2 to FF8.

The K input of the bistable multivibrator FF1 is returned to ground. The J inputs of the bistable multivibrators FF2 to FF8 are coupled directly to the outputs a7 to a13 of the counter Ct. The clock pulse inputs T of the bistable multivibrators FF1 to FF8 are coupled to the output of a clock generator C1, preferably via a switch S1. This is not shown in the drawing. The set inputs Pr of the bistable multivibrators FF1 to FF8 are coupled to the outputs of other logic elements G1 to G8, which may likewise be made up of AND gates. One input each of the AND gates G1 to G8 are coupled together to an output a2 of the counter Ct. The other inputs of the AND gates G1 to G8 are coupled to the outputs of the stages of a serial-parallel converter SPC employed as an input register and coupled at the input end to a trunk PCM an, over which digital signals to be converted into analog signals are applied thereto from a signal output unit with serial bits. In the present case, they may be PCM signals. Thus, the serial-parallel converter SPC has a number of stages corresponding to the number of bits making up a PCM word. The serial-parallel converter SPC is preferably a delay line 1 to which the bits of the digital signal involved may be applied at one end and which provides in a parallel fashion on one of a number of equidistant taps corresponding to the number of bits making up a digital signal the bits making up the digital signal. The AND elements G1 to G8 are coupled by the other inputs thereto to the outputs of such stages or taps of the serial-parallel converter SPC that the significance sequence of the individual bits of the digital signals to be converted is duly considered during the digital-to-analog conversion to be effected. With regard to the implementation of the serial-parallel converter SPC it should be noted that the spaces between adjacent taps and between the signal feeding end and the first tap of the delay line employed must be such that at the time of acceptance of the digital signal by the bistable multivibrators FF1 to FF8 the bits of the digital signal are just starting to appear at the taps coupled to the bistable multivibrators FF1 to FF8.

The bistable multivibrators FF1 to FF8 are all coupled by their reset inputs Rs to a counter output a1 and to a counter output a4 of the counter Ct.

The bistable multivibrators FF1 to FF8 are coupled by their outputs Q to separate inputs of a digital-to-analog converter DAC. In response to the code chain applied thereto, the digital-to-analog converter is designed to provide an appropriate analog output signal corresponding thereto. To this end, the digital-to-analog converter involved may be constituted by a conventional R-2R network, wherein constant currents from separate constant current generators may be applied to the junction points of the individual resistors provided. The constant current generators may be activated by the bits of the digital signal to be converted. Such a digital-to-analog converter is, for example, described further in British Pat. No. 1,158,453, FIG. 2; it is capable of converting the digital signal applied thereto into a corresponding analog signal in correspondence with a nonlinear characteristic.

There is, furthermore, coupled to the Q outputs of the bistable multivibrators FF1 to FF8 one input each of logic elements G21 to G28 which may likewise be made up of AND gates. The AND gates G21 to G28 are all coupled by their other inputs to an output a12 of the counter Ct, and are connected by their outputs to the inputs of a stage of a parallel-serial converter PSC employed as an output register. The Q outputs of the bistable multivibrators FF1 to FF8 are coupled to the stages of the parallel-serial converter PSC in such a sequence that the bits of the digital signals supplied by the parallel-serial converter PSC occur in the same significance sequence in which appear the bits of digital signals applied to the serial-parallel converter SPC. The parallel-serial converter PSC, which has a number of stages corresponding to the number of bits making up a digital signal, is connected at the output end to a trunk PCMab by means of which digital signals can be delivered to a signal output unit, such as to a switching arrangement corresponding to the switching arrangement considered. In the present case, the digital signals may be PCM signals. The AND elements G21 to G28, which are capable of transmission at specified times only, are associated with a signal output circuit Sab.

With regard to the parallel-serial converter PSC, it should also be noted that just like the serial-parallel converter SPC it may be a delay line having a number of equidistant taps corresponding to the number of bits making up a digital signal and to which in the present case are applied the bits of a digital signal to be converted. The serial bits are then delivered to the trunk PCMab from one end of the delay line.

The receiving unit of the telephone station Tn mentioned hereinabove is connected to the output of the digital-to-analog converter DAC by means of a low-pass filter Lp2 and a switch S3. The switch S3 and the above described switch S2 are connected by their operating inputs to an output a3 of the counter Ct. The counter Ct is here connected by a counter input e and by means of a switch S1 to the output of clock generator C. The enabling input of switch S1 is connected to the output Q of a bistable multivibrator BS1. The set input S of the bistable multivibrator BS1 is connected by an AND element GU to the output of a detector circuit Det which is coupled at the input end to the outputs of the serial-parallel converter SPC and to the side of a make contact of a cradle switch Fls associated with the telephone station Tn. The detector circuit Det in question may comprise a logic element which delivers a "1" output signal in response to a specified sequence of the bits making up a digital signal. This bit sequence may be a calling signal bit sequence signaling to the telephone station Tn the appearance of digital signals intended therefor which shall be converted into analog signals and shall be applied as such to the telephone station involved. The reset input R of the bistable multivibrator BS1 is coupled via a capacitor Kr to a contact of the cradle switch Hs associated with the telephone station Tn and carrying a "1" signal during the idle condition of the telephone station Tn. Furthermore, the contact in question is connected via the capacitor Kr to a reset input r of the counter Ct.

There is additionally connected to the output of the detector circuit Det the set input S of another bistable multivibrator BS2, hereinafter referred to as bistable circuit BS2. The bistable circuit BS2 is connected by its output Q to the enabling input of a switch S4 by means of which a call signal generator Tg is connected to the receiving unit of the associated telephone station Tn. The reset input R of the bistable circuit BS2 is connected to a contact of the cradle switch Hs, which carries a "1" signal when the telephone station Tn is in the operating condition. Furthermore, the reset input R of the bistable circuit BS2 is connected via a delay element Vg to the output Q of said bistable circuit. The significance of this circuitry comprising the bistable circuit BS2, the switch S4, the call signal generator Tg and, sometimes, the delay element Vg, will be discussed further below.

The switching arrangement under consideration, comprising the counter Ct, the buffer register containing the bistable circuits FF1 to FF8, the digital-to-analog converter DAC following the buffer register, and the comparator Cp represents an analog-to-digital converter working along the iterative principle or the successive approximation method. The analog-to-digital converter is provided in the telecommunication system by allocation to individual telephone stations.

After discussing the construction of the switching arrangement shown in FIG. 1, its operating mode will be discussed. First, it is pointed out that the clock repetition rate of the clock pulses emitted by the clock generator C1 and the construction of the counter Ct are such that counter output signals appear at the individual counter outputs at a given rate throughout the operation. This rate corresponds to the rate at which digital signals appear on the trunks PCMan and PCMab of the telecommunication system; this rate may, for example, correspond to a period of 125 $\mu$sec. This value corresponds to the pulse frame period in conventional PCM time division multiplex telephone switching systems.

It is assumed that digital signals appear on the trunk PCMan and are to be applied to the telephone station Tn in the form of analog signals. These digital signals are first applied to the serial-parallel converter SPC. The bits pertaining to the first digital signal may be available in such combination that the detector circuit Det delivers a "1" signal at the output end. Assuming that the cradle switch Hs is in its "on" position, this leads to the setting of the bistable circuit BS1, which was in the reset state previously. As a result, an enabling signal is applied to the enabling input of the switch S1, which closes this switch. This, in turn, causes clock pulses supplied by the clock generator C1 to be coupled to the counter input e of the counter Ct, thereby initiating a counting cycle of the counter Ct and a corresponding conversion cycle. The counter Ct, which in idle condition delivers a "1" counter output signal at the output a1, now delivers a "1" counter output signal at the counter output a2 in response to its activation. This counter output signal causes enabling of the AND elements G1 to G8 and, thereby, the immediate coupling of the bits of the digital signal to be converted and supplied by the serial-parallel converter SPC to the bistable circuits FF1 and FF8 making up the buffer register.

While the resetting of the bistable circuits FF1 to FF8 of the buffer register occurred by reason of the "1" counter output signal at the counter output a1, and by reason of the second "1" counter output signal at the counter output a2 the coupling of the bits of the digital or, as the case may be, the PCM signal to the bistable circuits FF1 to FF8, the appearance of the third "1" counter output signal at the counter output a3 causes the closing of the switches S2 and S3. These switch closures facilitate the delivery of the digital signal which is now used as an analog signal and which previously appeared on the trunk PCMan. An analog signal emitted under certain circumstances from the transmitting unit of the telephone station Tn is buffered by the capacitor Ko, i.e., the analog signal involved is to a certain extent sampled as a PAM signal.

Before discussing the further operations occurring in the counting cycle considered, it is pointed out that the reception of an analog signal by the receiving unit and, sometimes, the output of an analog signal by the transmitting unit of the telephone station Tn implies that the telephone station Tn is in its operating position. In order to switch the telephone station Tn to its operating position, first a calling signal, e.g. an acoustic calling signal, is delivered to the receiving unit of said telephone station Tn. This is done by utilizing the "1" signal of the detector circuit Det applied to the set input S of the bistable circuit BS1 for setting the bistable circuit BS2, which delivers in its set state a "1" signal closing the switch S4. The calling signal emitted from the calling signal generator Tg via the closed switch S4 finds its way to the receiving unit of the telephone state Tn. However, this is only the case if the telephone station Tn is still in its idle condition. If the calling signal involved is received in the telephone station Tn, which in the initial phase may still be in its idle condition, and if the telephone station Tn is switched to its operating state, a "1" signal is coupled to the reset input R of the bistable circuit BS2 by means of the switching cradle switch Hs which is then changing over, and because of the opening of the switch S4, interrupts the delivery of the calling signal to the receiving unit of the telephone station Tn.

The calling signal shutoff discussed hereinabove may also occur automatically if the delay element Vg shown in the drawing is employed. The delay period of the delay element Vg may have a given value of, e.g., 3 minutes. After this period expires, and if the delay element Vg in the illustrated switching arrangement is employed, the delivery of the calling signal to the receiving unit of the telephone station Tn would be terminated if the telephone station Tn were not switched over to its operating state.

Returning to the relevant counting cycle of the counter Ct, it is recognized that with the appearance of a "1" counter output signal at the counter output a4 the bistable circuits FF1 to FF8 of the buffer register are reset again. Further, the switches S2 and S3 are reopened. In this way, within the counting cycle under consideration in a first subinterval during which "1" counter output signals appear at the counter outputs a1 to a4, to be more precise at the counter outputs a2 and a3, of the counter Ct a conversion has been effected of a digital signal made up of a PCM signal into an analog signal which is passed on as a PAM signal to the receiving unit of the associated telephone station Tn.

The first subinterval mentioned hereinabove is followed immediately by a second subinterval. Counter output signals appear at the counter outputs a5 and a7 to a14 during the second subinterval of the counting cycle "1". The interval during which there appears a "1" counter output signal at the counter output a4 may be considered as a no-current period between the first and second subintervals of a counting cycle.

With the appearance of the "1" counter output signals at the counter outputs a5 and a7 to a14 within the ongoing counting cycle, the analog signal supplied from the transmitting unit of the telephone station Tn is converted into a digital signal.

After the appearance of a "1" counter output signal at the counter output a4, the bistable circuits FF1 to FF8 of the buffer register supply bits to their Q outputs which make up a digital signal corresponding to the analog signal held on the capacitor Ko.

With the appearance of the last "1" counter output signal at the counter output a15, the AND elements G21 and G28 are enabled for transmission. The result is that the bits supplied by the bistable circuits FF1 to FF8 are now delivered in parallel fashion, and after conversion in the parallel-serial converter PSC, transmitted in serial fashion to a signal receiving unit over the trunk PCMab.

After the appearance of a "1" counter output signal at the counter output a15, a "1" counter output signal can again appear at the counter output a1. In this way, a new counting cycle is initiated anew. Processes corresponding to those previously described take place until the cradle switch Hs of the telephone station Tn is returned to its initial position. In the initial position, which corresponds to the idle condition of the telephone station Tn, a "1" pulse is coupled to the reset input r of the counter Ct via the capacitor Kr, as well as to the reset input R of the bistable circuit BS1. As a result, the counter Ct attains its counter output position in which a "1" counter output signal is supplied at the counter output a1. With respect to this counter position, it should be noted that it can at the same time be considered as the first counter position of a counting cycle to be initiated anew. Due to the "1" counter output signal at the counter output a1, all the bistable circuits FF1 to FF8 of the buffer register are driven to their reset position. The bistable circuit BS1 is in the reset state upon the appearance of said "1" pulse at its reset input R. The described switching arrangement is now again in its starting condition.

As explained hereinabove, the counter Ct of the switching arrangement shown in FIG. 1 is put into operation for performing a counting operation, by the application of clock pulses from the clock generator Cl, only if a digital signal to be converted into an analog signal appears on the trunk PCMan. This implies that the analog-digital converter is here intentionally entered into service for the conversion of digital signals into analog signals and of analog signals into digital signals only upon the appearance of digital signals to be converted into analog signals. If it is desired to convert analog signals from the telephone station Tn in the analog-digital converter associated with the telephone station and to supply them as digital signals, then, in order to be able to put the analog-digital converter into operation, one must wait until the appearance of digital signals to be converted into analog signals and intended for the telephone station Tn involved. In this way it can be determined, for example, from a switching center to which the telephone station is connected with its analog-digital converter, when the application of communication signals from a telephone station, such as the telephone station Tn under consideration, is desired.

Figure 2:
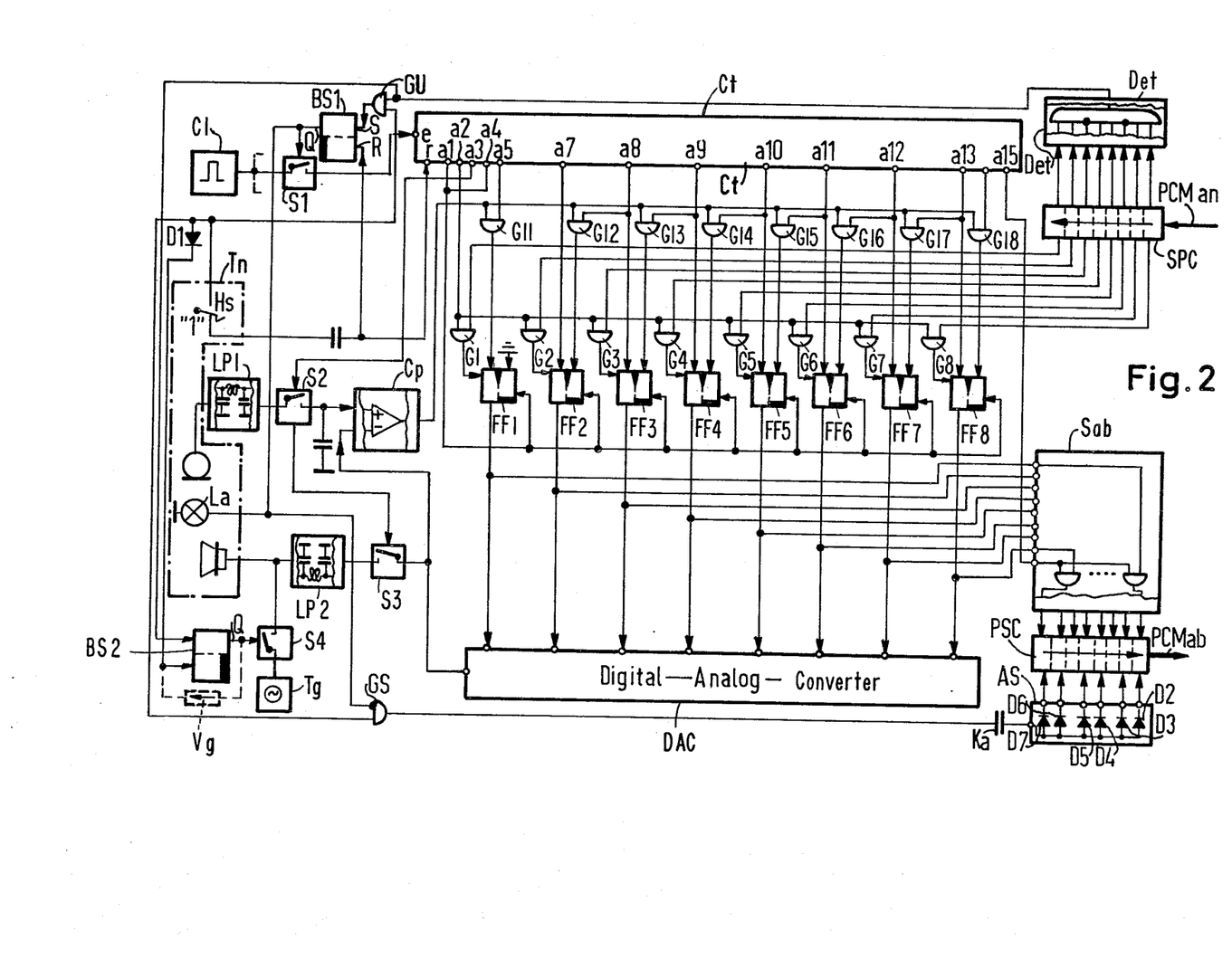
FIG. 2 is a schematic diagram a first alternative embodiment of the switching arrangement shown in FIG. 1.

FIG. 2 shows a first alternative arrangement of the switching arrangement shown in FIG. 1; the switching arrangement of FIG. 2 permits the entry into service of the analog-digital converter only if the telephone station Tn desires to provide analog signals and to supply them as digital signals on the trunk PCMab.

The switching arrangement described in FIG. 2 in that portion carrying out the signal conversion is constructed and operates like the FIG. 1 embodiment. Thus, this portion of the FIG. 2 embodiment will not be described again in connection with the following description of the features of the FIG. 2 embodiment.

The switching arrangement shown in FIG. 2 essentially differs from that of FIG. 1 by reason of a request signal output circuit As which, in this case, is made up of a number of diodes D2 to D7 connected by their cathodes to taps of the parallel-serial converter PSC in accordance with the bit sequence of a request signal to be supplied. The diodes D2 to D7 are connected by their anodes to the output of a blocking element GS via an isolating capacitor Ka at the output of the blocking element. The signal input to the blocking element GS is connected directly to the make-contact side of the cradle switch Hs, i.e., to the contact side of the cradle switch to which the reset input R of the bistable circuit BS2 is connected by an isolating diode D1. The blocking input of the blocking element GS is connected to the output of the above mentioned bistable circuit BS1 to which the switch Sw is likewise connected with its enabling input. An indicator unit La, e.g., a display lamp, associated with the telephone station Tn may likewise be connected to the output of the bistable circuit BS1.

With regard to the effect of the isolation diode D1 on the blocking element GS it is recognized that the fact that a "1" signal is prevented from being passed on from the output of the delay element Vg to the blocking element Gs by the isolation diode D1 has as a consequence that when the telephone station Tn is in the idle condition and upon the appearance of a calling signal bit sequence, which has led to the entry into service of the delay element Vg, no "1" signal and, thus, no request signal is supplied by the blocking element GS. In this case the output of such a request signal, since the telephone station is in the idle condition, would be completely unnecessary or undesirable.

To explain the operating mode of the switching arrangement of FIG. 2, let it be assumed that the telephone station Tn is in its idle condition in which the cradle switch Hs occupies the position illustrated in the drawing. Let it further be assumed that the telephone station Tn still has not been allocated a pulse train with pulses recurring in successive cycles. This means that the counter Ct has not been put into operation. Now, if the telephone station Tn is switched over to its operating state where it is ready to supply analog signals, the cradle switch Hs goes to the working position in which a "1" signal is applied to the signal input of the blocking element GS. At this instant, a "0" signal is applied at the enabling input of the blocking element GS, since the bistable circuit BS1 is still in its reset condition. Due to the appearance of the "0" signal the display lamp La remains off. The "1" signal now appearing at the output of the blocking element GS causes, via the isolating capacitor Ka, a brief output of "1" pulses over the diodes D2 to D7 to corresponding inputs of the parallel-serial converter PSC. Owing to the above mentioned connection of the diodes D2 to D7 to specified inputs of the parallel-serial converter PSC there is now in the parallel-serial converter PSC the bit sequence of a request signal. This bit sequence is coupled to the trunk PCMab, since it is assumed that the parallel-serial converter PSC supplies each bit sequence applied thereto from its output without further additional control. It is noted that between the output of the blocking element and the input of the calling signal output circuit a control circuit may be inserted, as needed, which supplies the "1" pulses with a mutual time interval corresponding to the duration of a calling signal, as long as the blocking element supplies a "1" signal.

The reception of the request signal in a device connected to the switching arrangement considered, for example, in a switching center to which the switching arrangement considered is connected via the trunks PCMan and PCMab, causes the allocation of a pulse train with pulses recurring in successive cycles in pulse frames to the telephone station Tn. In this case, too, the pulses may appear on the trunk PCMan; the first pulse of the pulse train which is modulated with a prespecified calling signal bit sequence is detected in the above mentioned detector circuit Det. Thereafter, the detector circuit Det supplies a "1" signal to one input of the AND element GU. Since a "1" signal is already applied to the other input of the AND element GU, the telephone station Tn is already in its operating state where it is ready to supply and to receive analog signals, and the bistable circuit BS1 is now set. As a result, a "1" signal appears at the wired output of the bistable circuit BS1. This "1" signal causes the switch S1 to close and further causes the blocking element GS to no longer supply a "1" output signal. Finally, the appearance of the "1" signal causes the display lamp La to light up. In this way, the switching arrangement considered is in the operating state in which analog signals supplied by the telephone station Tn are converted into digital signals. When in this state digital signals appear on the highway PCMan, the digital signals are converted into analog signals which are then applied to the receiving unit of the telephone station Tn. The ongoing conversion processes fully correspond to those described hereinabove in connection with the FIG. 1 embodiment.

When the telephone station Tn is switched over to its idle condition, the cradle switch Hs goes to its idle position, as shown in FIG. 2. In this way, the bistable circuit BS1 is reset, causing the switch S1 to reopen. Further, the counter Ct is reset to its initial counter position. In this way, the switching arrangement under consideration is again in its starting (idle) condition.

Figure 3:
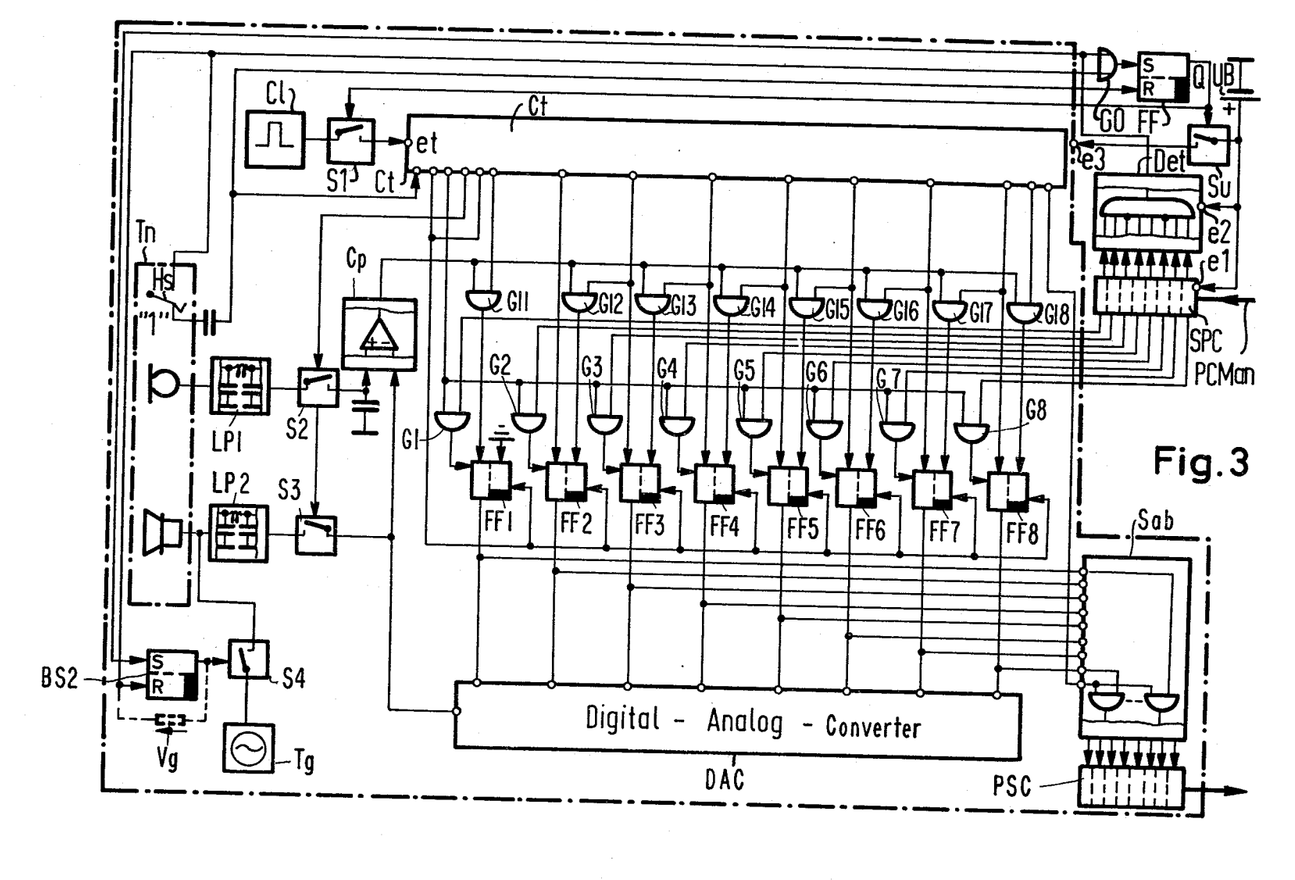
FIG. 3 is a schematic diagram of a second alternative embodiment of the switching arrangement shown in FIG. 1.

Whereas the analog-to-digital converter in the two switching arrangements shown in FIGS. 1 and 2 consume current even in idle condition, there is no current consumption in the idle condition in the case of the switching arrangement of FIG. 3.

The switching arrangement of FIG. 3 has been described in connection with FIG. 1 as far as the construction of the analog-to-digital converter, the associated telephone station Tn and the calling signal control circuit associated therewith are concerned, so that these circuit components need not be discussed further. In addition to these circuit components the switching arrangement of this invention also has circuit elements which apply an operating supply voltage to the analog-to-digital converter and to the associated telephone station Tn only when digital signals appear that are to be converted into analog signals; this may be indicated by the appearance of a prespecified calling signal bit sequence on the incoming trunk PCMan and/or when the telephone station Tn associated with the analog-to-digital converter is switched over from its idle condition to its operating condition. To this end, one input of an OR element GO is connected to the output of the detector circuit Det. The other input of the OR element GO is connected to the make-contact side of the cradle switch Hs of the associated GO is connected to the set input S of a bistable circuit FF. The bistable circuit FF is connected by its reset input R to the break-contact side of the cradle switch Hs of the telephone station Tn. The output Q of the bistable circuit carrying a "1" signal during the set status of the bistable circuit FF is connected to the enabling input of a switch Su. The switch Su connects a supply voltage input e3 of the analog-to-digital converter and its associated telephone station Tn to an operating supply voltage generator UB. In the present case, this operating supply voltage generator UB shall supply the working supply voltage for the analog-to-digital converter and the telephone station Tn associated therewith.

There are further connected to the operating supply voltage generator UB the detector circuit Det with a supply voltage input e2 and the serial-parallel converter SPC, which is directly connected to the incoming trunk PCMan. This implies that with the switch Su in open position only the detector circuit Det and the serial-parallel converter SPC receive a supply voltage, which results in a low current consumption when the switching arrangement is in the idle condition.

The operating mode of this switching arrangement will now be described. Let it be assumed that this switching arrangement is in the idle condition during which the cradle switch Hs of the telephone station Tn occupies the position shown in the drawing. Let it further be assumed that no digital signals appear on the incoming trunk PCMan and also no calling signal bit sequence. As a consequence, the switch Su is in the open position.

When a calling signal bit sequence appears on the incoming trunk PCMan and the detector circuit Det thereafter supplies a "1" control signal and/or the telephone station Tn goes to the working condition, during which the cradle switch Hs is changed over, the OR element GO supplies a "1" signal. As a result, the bistable circuit FF is set, closing the switch Su. In this way the operating supply voltage is applied to the circuit component enframed by a dotted line in the drawing. Furthermore, the "1" signal from the output Q of the bistable circuit FF causes the closing of the switch S1 by means of which the counter Ct is connected by its counting input et to the output of the clock generator C1. In this way, the required conversion processes can take place in the analog-to-digital converter.

When the "1" signal, which has set the bistable circuit FF, has been supplied by the detector circuit Det, a calling signal is applied to the receiving unit of the associated telephone station Tn, as described hereinabove.

When the telephone station Tn is changed over from its working condition to its idle condition, the cradle switch Hs of the telephone station Tn again goes to its position shown in the drawing. One result is that a "1" pulse find its way to the reset input R of the bistable circuit FF via the capacitor Kr. The bistable circuit FF is reset as a result, so that the switch Su is open again. This stops the delivery of the supply voltage to the input e3 of the switching arrangement comprising the analog-to-digital converter and its associated telephone station Tn, and the switching arrangement is again in its current-saving starting condition.

In conclusion, it is recognized that in deviation from the above described construction of the switching arrangement shown in the drawing one can proceed such that the set input S of the bistable circuit FF is connected to the output of an AND element, which is connected with one input to the make-contact side of the cradle switch Hs of the associated telephone station Tn and which with its other input is connected to the output of the detector circuit Det. In this case, an operating supply voltage would continually have to be applied to the calling signal control circuit associated with the telephone station Tn so as to signal to the associated telephone station Tn upon detection of a calling signal bit sequence by the detector circuit Det that it shall be switched over to its working condition, during which a "1" signal is then applied at both inputs of the aforesaid AND element.

The principles of the invention are described hereinabove by describing in enabling detail the construction and operation of three alternative embodiments. It will be recognized the specifically described forms of construction and operation and the operating parameters, such as logic levels, can be modified or changed in a variety of ways known to those skilled in the art without departing from the scope of the invention, as defined by the appended claims.

We claim:

1. In a telecommunication system having subscriber stations constructed to send and receive analog signals and wherein signals are transmitted from subscriber station to subscriber station in digital form, apparatus for converting an incoming digital signal into an analog signal and an analog signal into an outgoing digital signal comprising:
   input register means for receiving incoming digital signals;
   buffer register means having a plurality of bistable stages having first inputs connected to said input register means for receiving the incoming digital signals;
   digital to analog converter means having inputs connected to outputs of said bistable stages of said buffer register for converting the incoming digital signals to analog signals;
   analog output means connected to receive the output of said digital to analog converter;
   comparator means having one input connected to receive the output of said digital to analog converter and another input connected to receive an analog signal to be converted, the output of said comparator means being coupled to second inputs of said bistable stages of said buffer register;
   output register means having inputs coupled to the outputs of said bistable stages of said buffer register for receiving the outgoing digital signals corresponding to the analog signal received by said another input of said comparator means;
   multistage binary counter means having a predetermined starting position and a plurality of outputs coupled to said buffer register means for enabling said buffer register and said digital to analog converter to convert the incoming digital signals to analog signals during a first portion of the counting interval and for enabling the combination of said analog comparator, said buffer register and said analog to digital converter to convert analog signals to outgoing digital signals during a second portion of the counting interval;
   clock generator means connected to said binary counter means for driving said binary counter means; and
   initiating means for actuating said binary counter means responsive to the reception of a predetermined calling bit sequence in said input register means, said initiating means including detector means connected to said input register means for producing a first signal responsive to the appearance of the calling bit sequence in said input register, sensing means for producing a second signal responsive to the subscriber station being rendered operative and first switching means for connecting said clock generator to said binary counter means when said first and second signals appear in coincidence.

2. The apparatus defined in claim 1 wherein said first switching means includes a bistable switching circuit and a switch, said bistable switching circuit being switched to a first state responsive to the coincidence of said first and second signals and to a second state when the subscriber station is inoperative.

3. The apparatus defined in claim 1 further comprising:
   second switching means for switching the subscriber station between its operative and inoperative states, wherein said sensing means is operative in response to the operative state of said second switching means.

4. The apparatus defined in claim 3 further comprising means for producing a calling signal and coupling it to the receiving portion of the subscriber station responsive to said first signal,
   said calling signal being removed from the receiver portion a predetermined time after said second switching means is in its operative state.

5. The apparatus defined in claim 1 further comprising:
   a voltage source; and
   third switching means for connecting said voltage source in response to said first signal.

6. The apparatus defined in claim 1 further comprising:
   a request signal circuit for supplying a request signal to said output register in response to said second signal.

* * * * *